United States Patent [19]

Ommen et al.

[11] Patent Number: 5,324,570
[45] Date of Patent: Jun. 28, 1994

[54] MICROELECTRONICS PACKAGE

[75] Inventors: Joseph M. Ommen, Tempe; Paul M. Rogers, Sun Lakes, both of Ariz.

[73] Assignee: The Carborundum Company, Niagara Falls, N.Y.

[21] Appl. No.: 993,968

[22] Filed: Dec. 17, 1992

Related U.S. Application Data

[63] Continuation of Ser. No. 615,206, Nov. 19, 1990, abandoned.

[51] Int. Cl.$^5$ .............................. B32B 9/00
[52] U.S. Cl. ...................... 428/209; 428/426; 428/432; 428/457; 428/901
[58] Field of Search ............. 428/457, 432, 426, 209, 428/901

[56] References Cited

U.S. PATENT DOCUMENTS

| | | | |
|---|---|---|---|
| 3,561,110 | 2/1971 | Feulner et al. | 29/602 |
| 3,838,204 | 9/1974 | Ahn et al. | 174/68.5 |
| 3,852,877 | 12/1974 | Ahn et al. | 29/625 |
| 4,131,516 | 12/1978 | Bakos et al. | 204/15 |
| 4,376,287 | 3/1983 | Sechi | 357/80 |
| 4,446,477 | 5/1984 | Currie et al. | 357/74 |
| 4,684,446 | 8/1987 | Charles et al. | 204/15 |
| 4,714,905 | 12/1987 | Bernstein et al. | 333/167 |
| 4,732,780 | 3/1988 | Mitoff et al. | 427/125 |
| 4,835,059 | 5/1989 | Kodato | 428/432 |
| 4,861,641 | 8/1984 | Foster et al. | 428/137 |
| 4,894,271 | 1/1990 | Hani et al. | 428/137 |
| 4,899,118 | 2/1990 | Polinski, Jr. | 333/246 |
| 4,917,958 | 4/1990 | Akai et al. | 428/457 |
| 4,925,723 | 5/1990 | Bujatti et al. | 428/137 |
| 4,942,076 | 7/1990 | Panicker et al. | 428/137 |

FOREIGN PATENT DOCUMENTS 57-056953  5/1982  Japan .

OTHER PUBLICATIONS

Panicker et al "Thermal Substrates: A New Microwave Substrate Technology for Thermal Management and Low Parasitic Effects" *Microwave Journal*, pp. 99–105.
Spitz "Ceramics Keep Circuits Cool" *Electronic Packaging and Production* vol. 29, No. 7, Jul. 1989 Massachusetts US pp. 36–41.

*Primary Examiner*—Patrick J. Ryan
*Assistant Examiner*—Kam F. Lee
*Attorney, Agent, or Firm*—Renner, Kenner, Greive, Bobak, Taylor & Weber

[57] ABSTRACT

A microelectronics substrate assembly comprising: an advanced ceramics substrate having a top surface and a bottom surface; a first metallized distribution plane on said top surface and a second metallized distribution plane on said bottom surface; an electrical connection between said first and second distribution planes; at least one first metallized pad on said top surface electrically isolated from said first distribution plane and at least one metallized pad on said bottom surface, electrically isolated from said second distribution plane, wherein said distribution planes and said metallized pads are arranged substantially symmetrically with respect to a plane between and parallel to said top and said bottom surfaces.

13 Claims, 2 Drawing Sheets

MICROELECTRONICS PACKAGE

This application is a continuation of copending application Ser. No. 07/615,206, filed Nov. 19, 1990, now abandoned.

TECHNICAL FIELD

The present invention relates to a microelectronics package substrate suitable for automated processing. The present invention relates more particularly to a microelectronics package substrate suitable for the automated processing of power transistor microelectronic packages.

BACKGROUND OF THE INVENTION

Microelectronic packages for power transistors have included an alumina ceramic substrate on whose top surface is disposed a metal heat sink such as copper onto which the die is attached, and two metallized pads to which leads are attached and the die is wire bonded. A metal heat sink, again such as copper, is disposed on the bottom surface of the ceramic substrate. The finished assembly is utilized in electronic apparatus containing circuit boards. The circuit board generally has cavities for accepting the power transistor package, and the bottom heat sink is placed in thermal contact with a heat sink located at the bottom of the cavity of the circuit board.

Although the metal heat sinks are useful in conducting heat away from the power transistor device while in operation, the mismatch between the thermal expansion coefficient of the material of the power device and the top metal heat sink, and between the ceramic and both metal heat sinks can cause failure of the bonds between these elements during thermal cycling experienced in operation. The same problems encountered with metal heat sinks are experienced in the prior art where beryllia is utilized as a substrate material.

Further, the packages of the prior art must be oriented in a particular position for assembly, due to the asymmetric distribution of package elements. This lessens the capability of the package to be easily assembled by automated equipment, and requires complex apparatus for positioning the substrate for processing.

It is therefore an object of the present invention to provide a microelectronics package without a significant thermal expansion coefficient mismatch between the package elements.

It is a further object of the present invention to provide a microelectronics package which is easily assembled by automated processing.

These and other objects and advantages of the invention set forth herein are accomplished by the present invention as described in the Specification and Claims which follow.

SUMMARY OF THE INVENTION

The present invention provides a microelectronic package substrate assembly comprising:
- an advanced ceramics substrate having a top surface and a bottom surface;
- a first metallized distribution plane on said top surface and a second metallized distribution plane on said bottom surface;
- an electrical connection between said first and second distribution planes;
- at least two metallized pads on said top surface electrically isolated from said first distribution plane, wherein said metallized pads are arranged substantially symmetrically with respect to a plane transverse to a longitudinal plane of the substrate at its midpoint.

The present invention further provides a microelectronics substrate assembly comprising:
- an advanced ceramics substrate having a top surface and a bottom surface;
- a first metallized distribution plane on said top surface and a second metallized distribution plane on said bottom surface;
- an electrical connection between said first and second distribution planes;
- at least one first metallized pad on said top surface electrically isolated from said first distribution plane and at least one metallized pad on said bottom surface, electrically isolated from said second distribution plane, wherein said distribution planes and said metallized pads are arranged substantially symmetrically with respect to a plane between and parallel to said top and said bottom surfaces.

The present invention further provides a method for making microelectronic package substrate assemblies comprising:
- providing an advanced ceramic sheet having a plurality of holes extending therethrough;
- introducing a metallizing paste into said holes;
- firing said paste metallized sheet;
- metallizing a distribution plane on the top surface and the bottom surface of said advanced ceramic sheet in electrical contact with the fired paste; and,
- metallizing at least one pad in electrical isolation from said distribution plane on the top surface and the bottom surface of said advanced ceramic sheet.

DETAILED DESCRIPTION OF THE INVENTION

We have been able to eliminate the metal heat sinks, and metal heat sinks used in combination with beryllia ceramic substrates, integral to the microelectronics package without loss of required thermal conduction of heat away from the electronic device, by utilizing an advanced ceramic substrate. Further, the use of the advanced ceramic substrate overcomes the mismatch of the thermal expansion coefficient between the material of the electronic device and the metal heat sink or beryllia substrate, and between the heat sink and the alumina ceramic substrate.

The term "advanced ceramic substrate" as used herein includes substrates in which the ceramic contained is substantially aluminum nitride and/or silicon carbide, or in which the ceramic contained includes either aluminum nitride or silicon carbide as a major component, together with other components which do not adversely affect the thermal conductivity and coefficient of thermal expansion required.

Aluminum nitride has a coefficient of thermal expansion compatible with semiconductor chips at approximately $4.3 \times 10^{-6}/°$ C., and a very high thermal conductivity of about 140–220 W/mK. Silicon carbide also has a very compatible coefficient of thermal expansion at $3.7 \times 10^{-6}/°$ C. and an excellent thermal conductivity of about 270 W/mK.

The method of preparing the microelectronic packages according to the invention, and the arrangement of package elements makes the packages amenable to automated processing to form the package substrate assembly and to complete manufacture of the microelectronic package containing the electronic device.

Figure 1:
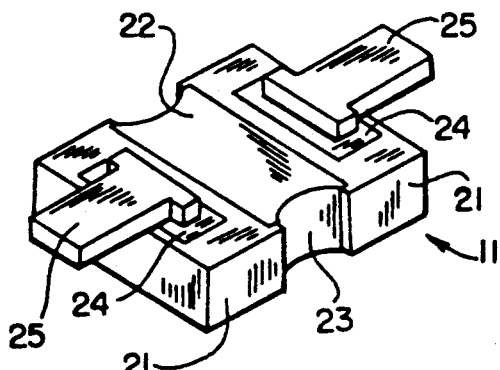
FIG. 1 is an elevation view of a microelectronic package substrate assembly having wraparound metallization of the distribution plane.
Figure 2:
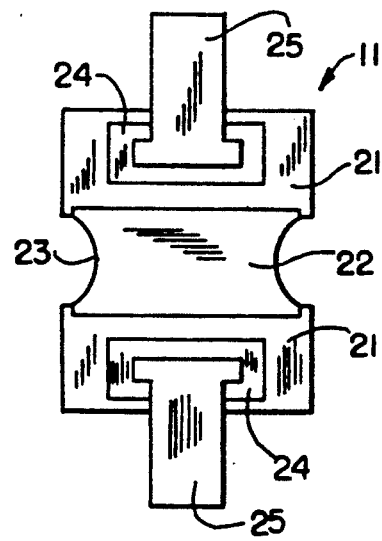
FIG. 2 is a plan view of the top surface of the microelectronic package substrate assembly of FIG. 1.

FIGS. 1 and 2 show microelectronic package substrate assembly 11 comprising advanced ceramic substrate 21 having metallized distribution plane 22 on which an electronic device such as a transistor (not shown) can be mounted. Distribution plane 22 is electrically connected to metallized face 23 formed from a castellation hole in substrate 21. Metallized pads 24 are disposed on the top surface of substrate 21, and are electrically isolated from distribution plane 24. Leads 25 can be attached in electrical connection to pads 24. The electronic device (not shown) can then be wire bonded to leads 25 to access the external environment. The distribution plane can be utilized to provide ground, or carry alternating current, direct current, signals, or apply voltage.

FIG. 2 shows the top surface of microelectronic package substrate assembly 11 on which leads 25 are attached. Pads 24 are arranged substantially symmetrically with respect to a plane transverse to the longitudinal plane of substrate 21.

Figure 3:
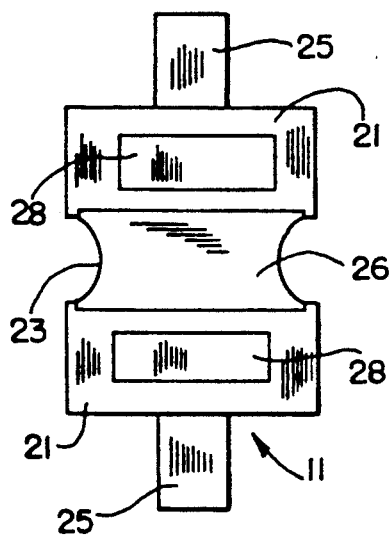
FIG. 3 is a plan view of the bottom surface of a microelectronic package substrate assembly having wraparound metallization of the distribution plane and having symmetrically arranged metallized pads.

FIG. 3 shows the bottom surface of advanced ceramic substrate 21 on which bottom distribution plane 26 is metallized. Bottom distribution plane 26 is in electrical contact with face 23 of the castellation hole, and is thus in electrical contact with distribution plane 22 of the top surface. Leads 25 are seen protruding from the top surface. Bottom distribution plane 26 may serve as the circuit board heat sink attach metallization for incorporation of an electronic device containing microelectronic package substrate assembly to a circuit board.

FIG. 3 also shows the bottom distribution plane 26 being electrically isolated from two metallized bottom pads 28. The top and bottom surface of microelectronic package substrate assembly 11 (as shown in FIGS. 2 and 3 respectively) are thus symmetrically arranged such that leads 25 (shown in FIG. 3 to be protruding from the top surface) can be attached to either the top or bottom surface of microelectronic package substrate assembly 11 with equal effect. Pick and place machines can be utilized, rather than optical recognition apparatus, to facilitate automated handling and further processing without needing complex apparatus to orient the assembly.

Figure 4:
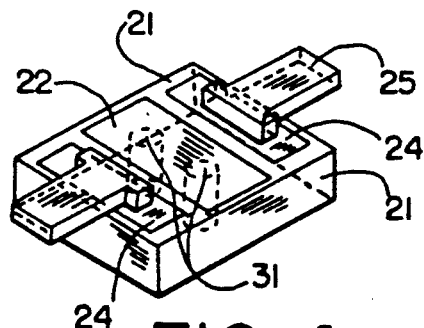
FIG. 4 is an elevation view of a microelectronic package substrate assembly having distribution vias.
Figure 5:
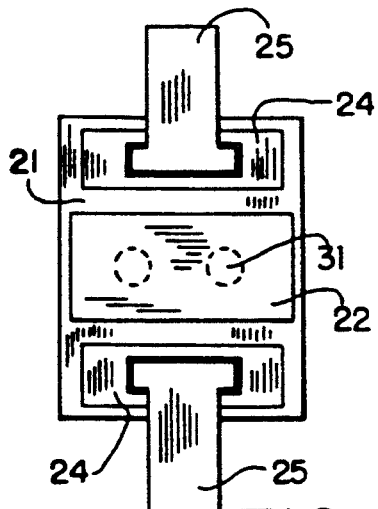
FIG. 5 is a plan view of the microelectronic package substrate assembly of FIG. 4.

An alternative embodiment of the microelectronic package substrate assembly is shown in FIGS. 4 and 5. Onto advanced ceramic substrate 21 is metallized distribution plane 22, which is electrically connected to vias 31 in substrate 21. Metal filled vias 31 communicate with and are electrically connected to bottom distribution plane 26 shown in FIG. 6. Although one via is sufficient to provide electrical connection between distribution plane 22 and bottom distribution plane 26, incorporating a plurality of vias in the assembly provides sufficient redundancy and increased reliability to compensate for any defects in the filling of the vias during manufacture.

Figure 6:
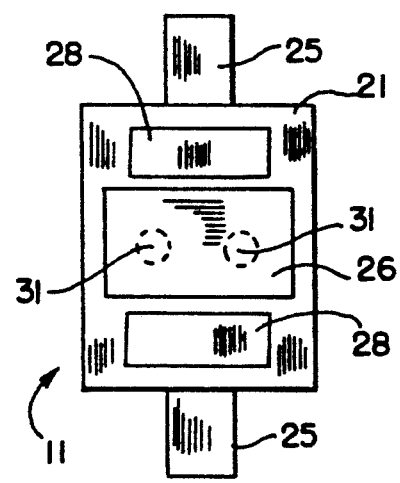
FIG. 6 is a plan view of the bottom surface of a microelectronic package substrate assembly having distribution vias.

Referring to FIGS. 4, 5 and 6, pads 24 are metallized onto the top surface of advanced ceramic substrate 21 in electrical isolation from distribution plane 22 and in symmetrical arrangement as discussed above. Symmetry is maintained when vias 31 are substituted for face 23 as the electrical connection between the distribution planes in FIG. 3, and bottom pads 28 are metallized onto the bottom surface of substrate 21. Leads 25 can be attached to pads 24, or because of the symmetry achieved before die attachment, to bottom pads 28.

Figure 7:
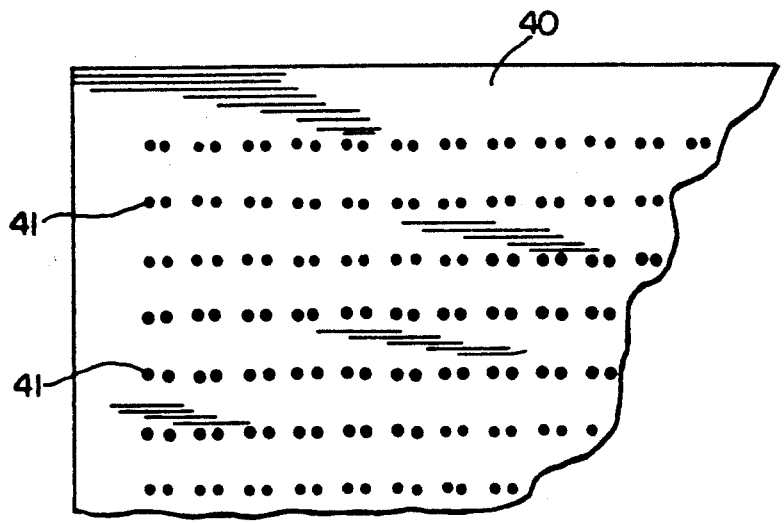
FIG. 7 is a partial plan view of a substrate sheet with vias.

Microelectronic package substrate assemblies according to the present invention can be made in volume by forming a plurality of assemblies on an advanced ceramic sheet 40, shown in FIG. 7. Sheet 40 can be provided with via holes 41 in a green or sintered condition, by tape casting or extruding, punching and eventually firing; by pressing with holes and eventually firing; or, by drilling a sintered sheet.

Via holes 41 can be metallized by thick or thin film techniques. A suitable thin film technique is disclosed in U.S. Pat. No. 4,942,076, which is incorporated herein by reference. In the thick film technique, a conventional tungsten paste can be introduced into via holes 41 by screening, and a pattern of tungsten can be applied to form circuits (distribution planes and pads) by screen printing also. Where metallization is applied to a green sheet, the sheet can be scored to isolate separate assemblies, and the green sheet and tungsten can be co-fired to form a metallized, sintered sheet.

Figure 8:
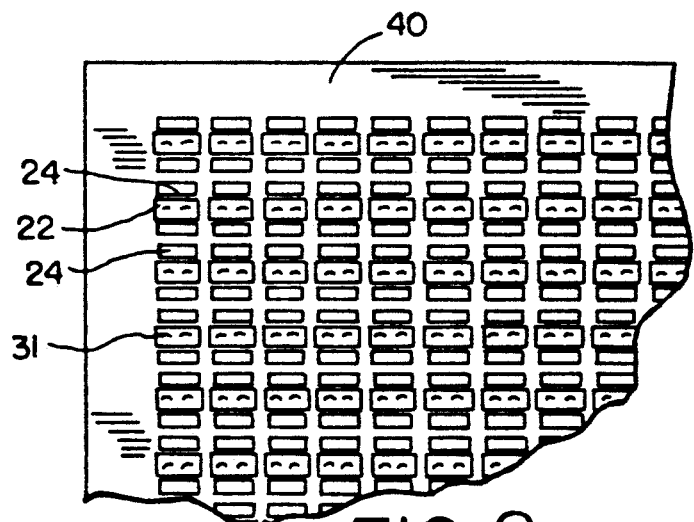
FIG. 8 is a partial plan view of a substrate sheet with metallization.

FIG. 8 shows the top surface (or symmetric bottom surface) of sheet 40 containing distribution planes 22 (or bottom distribution planes) in contact with vias. Metallized pads 24 are associated with, but electrically isolated from, the distribution planes.

The metallized sheet can be fragmented to form separate substrates. These are further processed by further metallization, such as barrel plating with nickel and thereafter depositing gold. Leads are brazed onto the pads, preferably with a palladium/silver solder or a low temperature gold alloy. This prevents diffusion of nickel through the gold, maintaining a gold surface for die attachment by reflowing or thermal scrubbing. In another embodiment, the gold layer can be omitted and the die can be mounted on the nickel with a eutectic solder.

The above thick film method can be used to make substrate assemblies having a wraparound metallization. In this instance, via holes are replaced with castellation holes, and the substrate assemblies are separated so as to place the metallized hole at the side surface.

Other conventional additive and subtractive processes of metallization are applicable to the present invention. For example, via holes can be metallized by screening in a tungsten paste, firing, filling the hole with copper and subsequently firing. The sheet can be circuitized by co-sputtering thin film titanium/tungsten, followed by sputtering copper. Resist is applied, and nickel and then gold are applied by rack plating in electroless or electrolytic techniques. The resist is stripped, a pattern etched, the substrates are separated, and the lead is brazed onto the pad.

Figure 9:
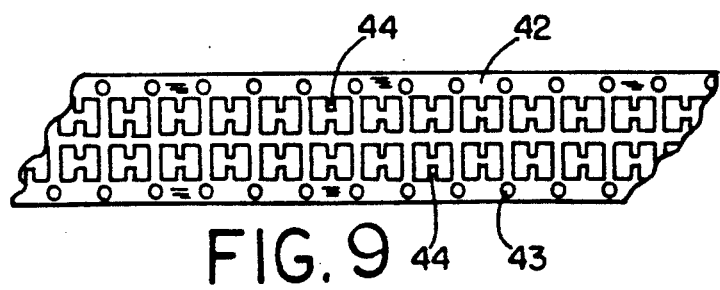
FIG. 9 is a partial plan view of a lead frame.

Lead frames can be brazed onto separated substrate assemblies, but an advantage of the invention is the ability to process multiple substrates in a lead frame carrier before separation into individual assemblies. As shown in FIG. 9, lead frame 41 can be brazed onto individual substrates, aligning with registration holes 42, to connect leads 44 to pads (not shown). After attachment, leads 44 can be separated from the frame 42 by cutting, and the individual leaded substrate assemblies can be separated, or the lead frame carrier with multiple assemblies can be maintained for subsequent processing, such as die attachment and wire bonding.

The substrate assemblies of the present invention are particularly suited to packaging transistors, such as low- to high-power field effect transistors, whether silicon-based or gallium arsenide-based, and use with radio frequency devices is possible. Devices with less than three leads, such as inductors or capacitors can also be packaged, such as where one or more leads of the package are interconnected.

A die attached substrate assembly can be mounted into a circuit board, such as a PC board. The lead frame is soldered to the circuitized board, and the bottom distribution plane (and bottom isolated pads) are bonded to the circuit board heat sink, placing the substrate assembly in thermal contact with the board for heat conduction away from the die.

The microelectronic package substrate assembly of the present invention, therefore, accomplishes the objects set forth above. The use of metal heat sinks and ceramics, such as beryllia, with poor thermal coefficient of expansion match to semiconductor material is avoided. A simplified design is provided which permits high volume, automated production, and which results in higher reliability and less cost. Symmetry of design permits use in automated processes, and in preferred embodiments, without the need to re-orient the package substrate assembly from top to bottom. The package can be made either shorter or longer from lead side to lead side versus the other direction to further permit automated handling for easy orientation and correct die placement.

Thus, the objects of the invention are accomplished by the present invention, which is not limited to the specific embodiments described above, but which includes variations, modifications and equivalent embodiments defined by the following claims.

We claim:

1. A microelectronics substrate assembly comprising:
   an advanced ceramics substrate having a top surface and a bottom surface;
   a first metallized distribution plane on said top surface and a second metallized distribution plane on said bottom surface;
   an electrical connection between said first and second distribution planes;
   at least two metallized pads on said top surface electrically isolated rom said first distribution plane, wherein said metallized pads are arranged substantially symmetrically with respect to a plane transverse to a longitudinal plane of the substrate at its midpoint, wherein said advanced ceramics substrate comprises substantially, or ass a major component, a ceramic selected from the group consisting of aluminum nitride, silicon carbide, and mixtures of aluminum nitride and silicon carbide.

2. The microelectronic package substrate assembly of claim 1 wherein said electrical connection comprises a plurality of metallized vias.

3. The microelectronic package substrate assembly of claim 1 wherein said electrical connection comprises a metallized surface of the periphery of at least one substrate edge indentation.

4. The microelectronic package substrate assembly of claim 1 wherein a lead is attached to at least one said metallized pad.

5. The microelectronic package substrate assembly of claim 1 further comprising at least two bottom metallized pads on said bottom surface electrically isolated from said second distribution plane, wherein said bottom metallized pads are arranged substantially symmetrically with respect to a plane transverse to a longitudinal plane of the substrate at its midpoint.

6. A microelectronic package substrate assembly comprising:
   an advanced ceramics substrate having a top surface and a bottom surface;
   a first metallized distribution plane on said top surface and a second metallized distribution plane on said bottom surface;
   an electrical connection between said first and second distribution planes;
   at least one first metallized pad on said top surface electrically isolated from said first distribution plane and at least one metallized pad on said bottom surface, electrically isolated from said second distribution plane,
   wherein said distribution planes and said metallized pads are arranged substantially symmetrically with respect to a plane between and parallel to said top surface and said bottom surface, wherein said advanced ceramics substrate comprises substantially, or as a major component, a ceramic selected from the group consisting of aluminum nitride, silicon carbide, and mixtures of aluminum nitride and silicon carbide.

7. The microelectronic package substrate assembly of claim 6 wherein said electrical connection comprises a plurality of metallized vias.

8. The microelectronic package substrate assembly of claim 6 wherein said electrical connection comprises a metallized surface of the periphery of at least one substrate edge indentation.

9. The microelectronic package substrate assembly of claim 6 having a least two said metallized pads on said top surface and on said bottom surface.

10. The microelectronic package substrate assembly of claim 6 wherein a lead is attached to said at least one metallized pad on one of said top surface and said bottom surface.

11. A microelectronic package substrate assembly as in claim 4 including an electronic device mounted on said first metallized distribution plane and in electrical connection with said lead.

12. A microelectronic package substrate assembly as in claim 1 wherein leads are attached to at least two metallized pads on said top surface, and said electronic device is a transistor in electrical connection to said leads.

13. A microelectronic package substrate assembly as in claim 10 including an electronic device mounted on said first metallized distribution plane and in electrical connection with said lead.

* * * * *